United States Patent [19]

Papst et al.

[11] Patent Number: 4,513,812
[45] Date of Patent: Apr. 30, 1985

[54] HEAT SINK FOR ELECTRONIC DEVICES

[75] Inventors: Georg Papst, St. Georgen; Guenter Wrobel, Villingen; Ulrich Koletzki, St. Georgen, all of Fed. Rep. of Germany

[73] Assignee: Papst-Motoren GmbH & Co. KG, St. Georgen, Fed. Rep. of Germany

[21] Appl. No.: 391,458

[22] Filed: Jun. 23, 1982

[30] Foreign Application Priority Data

Jun. 25, 1981 [CH] Switzerland ............ 4189/81

[51] Int. Cl.³ .................................... H01L 23/36
[52] U.S. Cl. ............................. 165/80 B; 165/121; 174/16 HS; 361/384
[58] Field of Search ............ 165/121, 122, 126, 80 B, 165/80 D, 80 C; 357/81; 361/386, 384, 383, 382, 381; 174/16 HS, 16 R, 15 R

[56] References Cited

U.S. PATENT DOCUMENTS

| 3,327,776 | 6/1967 | Butt | 361/382 X |
|---|---|---|---|
| 3,462,553 | 8/1969 | Spranger | 361/383 X |
| 3,592,260 | 7/1971 | Berger | 361/384 X |
| 3,778,551 | 12/1973 | Grodinsky | 361/384 X |
| 3,790,859 | 2/1974 | Schraeder et al. | 361/384 |
| 3,790,860 | 2/1974 | Verdisco | 361/384 |
| 3,833,837 | 9/1974 | West | 361/384 |
| 4,027,206 | 5/1977 | Lee | 361/384 |
| 4,158,875 | 6/1979 | Tajima et al. | 361/384 |
| 4,277,816 | 7/1981 | Dunn et al. | 361/384 |
| 4,399,485 | 8/1983 | Wright et al. | 361/384 X |

FOREIGN PATENT DOCUMENTS

| 2743708 | 4/1979 | Fed. Rep. of Germany | 361/384 |
| 750767 | 7/1980 | U.S.S.R. | 361/381 |

OTHER PUBLICATIONS

V. L. Steenburgh, "Modular Power System Packaging", *IBM Technical Disclosure Bulletin*, vol. 19, No. 3, Aug. 1976.

*Primary Examiner*—Sheldon J. Richter
*Attorney, Agent, or Firm*—Fitch, Even, Tabin & Flannery

[57] ABSTRACT

A heat sink for instrument parts and electronic devices is provided, the heat sink including an elongated rectangular plate having cooling ribs, the ribs extending in the longitudinal direction of the plate. A fan having radial discharge is mounted on the plate to effect ventilation of the ribs and the devices mounted on the heat sink.

13 Claims, 7 Drawing Figures

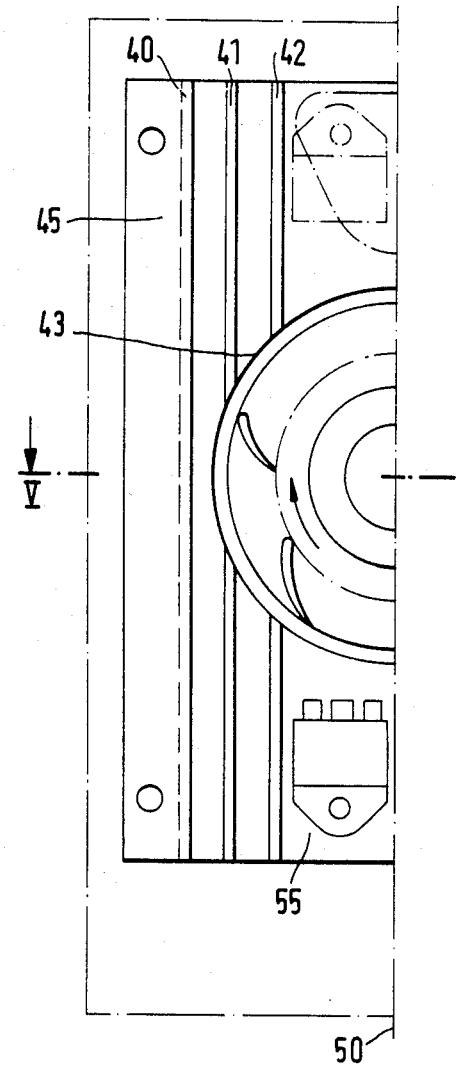
FIG. 4
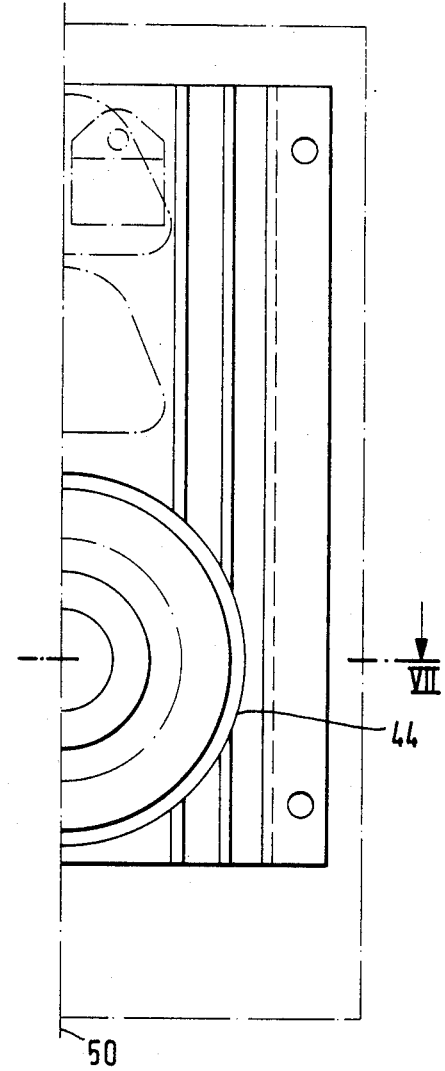
FIG. 6
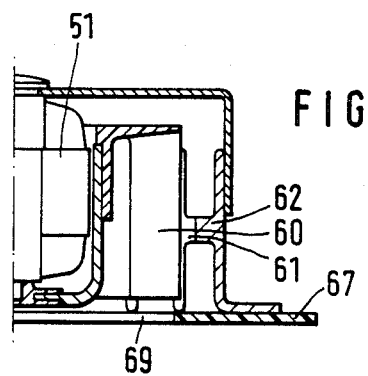
FIG. 5
FIG. 7

HEAT SINK FOR ELECTRONIC DEVICES

The invention relates to a heat sink for electronic devices, such as solid state devices, and includes an elongated, rectangular flanged plate having additional cooling ribs particularly on the side or sides receiving the electronic devices, the ribs extending parallel to each other in the longitudinal direction of the plate and perpendicularly of the plate. The ribs preferably are in groups with a channel or space separating the groups. The electronic parts are mounted within the channel or space between the groups.

Modern electronic devices, such as used in electronic circuits, particularly thyristors, have high performance characteristics, low in mass resulting in high density of operation that develop great amounts of heat in operation. The devices cannot store this heat, and so the heat must be dissipated. This is the function of the heat sinks of the above described kind, the electronic parts being mounted on the heat sinks preferably in good heat transfer contact. The heat sink first transfers the developed heat to a greater area. But this is not sufficient in most instances, and so the further removal of heat is brought about by forced cooling air. Generally, such forced air is not precisely directed to where it provides the most efficient heat transfer, resulting in excess cooling air being developed and an excess of drive power being consumed.

It is an object of the invention to provide a heat sink of the above described kind having efficient forced ventilation, simple, precise and at a low cost.

Other objects and advantages of the invention will become apparent from the following detailed description taken in connection with the accompanying drawings, wherein:

FIG. 4 is a partial view in plan illustrating substantially one-half of still another embodiment of the invention shown in FIG. 1 divided along the plane of symmetry;

FIG. 5 is a view partly in section taken along the line V—V of FIG. 4;

FIG. 6 is a partial view in plan illustrating another embodiment of the invention shown in FIG. 4; and FIG. 7 is a view partly in section taken along the line VII—VII of FIG. 6.

Briefly, the invention includes a heat sink having longitudinally extending cooling fins or ribs and a fan having an axial flow inlet and radial flow outlet, the fan axis being perpendicular to the plane of the heat sink and the blade wheel of the fan being disposed in a recess within the array of ribs.

According to the invention, cool air is blown directly and almost exclusively between the cooling ribs at the places where such air is needed for the most effective heat transfer. None of the air is mis-directed and not utilized from a heat transfer point of view, and so a relatively modest air output is quite adequate to accomplish the cooling. It is sufficient to install a small fan with a small power motor, which itself develops only a limited energy loss by heat.

Also from the point of view of the air flow technique, the invention provides a simple solution, because the air conducting members necessary for the best operation of the fan are provided by the same ribs that are already provided and utilized for expanding the surface of the heat sink for heat dissipation. The result is still better if, according to an expedient development of the invention, a recess for the fan having radial directives snugly radially surrounds the fan wheel, and the recess extends laterally of the plate but in between the two outermost ribs.

Cool air once blown into the ducts between the ribs is forced to flow along the full length of the duct by providing all ribs of the same height and a cover mounted to overlie the free edges of the ribs.

The invention is also advantageously applicable in conjunction with heat sinks where both sides of the plate are formed as device mounting surfaces and are provided with cooling ribs. A recess is then provided in each of the sides, the two located to be coaxially related. An opening is then provided in the plate to provide communication between the coaxially related recesses and a pass-through fan blade wheel is disposed within such recesses.

The fan can be disposed in about the longitudinal center of the heat sink so that the rib portions are of about equal length in either longitudinal direction, and air is blown therethrough. But the fan also can be disposed at one end of the plate, and a closing strip mounted over the ends of the cooling ribs near the fan to provide a one-ended closure for the ducts formed between the cooling ribs. Such closing will then prevent a loss by unused flow of cooling air at that end.

Figure 1:
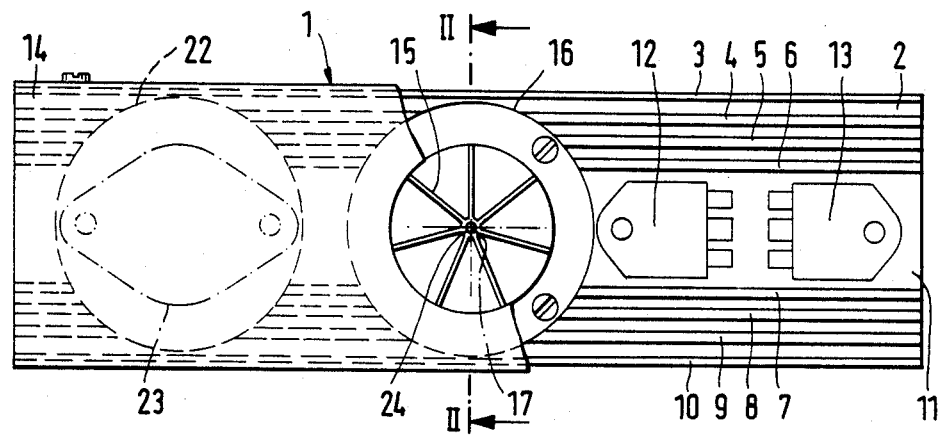
FIG. 1 is a plan view of a first embodiment of a heat sink according to the invention partly broken away to show a device mounting side.
Figure 2:
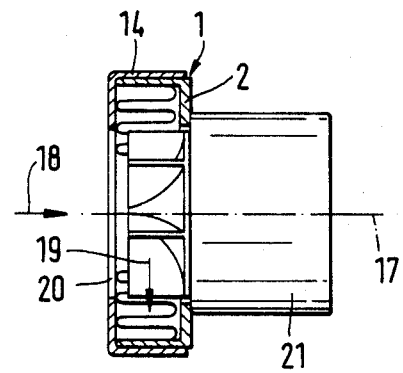
FIG. 2 is a view partly in section taken along the line II—II of FIG. 1.

More particularly, and referring first to FIGS. 1 and 2, a heat sink 1 is provided having a plate 2 which, as seen in FIG. 1, has the configuration of an elongated rectangle. Preferably, the heat sink is metallic and made of, for example, aluminium or an alloy of aluminium. The embodiment in FIG. 1 shows only one side as the device mounting side, which faces the observer of FIG. 1. There are two groups of cooling ribs 3, 4, 5, and 6 (one group) and 7, 8, 9, and 10 (the other group). The ribs are of the same height and are disposed in parallel to each other in the longitudinal direction of the plate 2 and are perpendicular to the plate. The ribs are shown equally spaced within groups 3, 4, 5, 6 on one side and 7, 8, 9, 10 on the other side. A wider distance defining a channel 11 separates the groups. The electronic devices to be cooled as, for example, transistors 12 and 13 indicated by the dash-dotted lines, may be mounted within this channel 11.

Referring now to FIG. 2, it can be seen that the cooling ribs are of the same height. They are overlayed by a formed metal cover 14 of pan shape or U-profile. A circular recess 16 (FIG. 1) is provided in the array of cooling ribs, and an axial to radial fan wheel 15 is disposed in the recess. The fan is mounted coaxially to the circular recess 16 from the back side of the plate 2 with the fan axis 17 perpendicular to the plate 2.

The purpose of the fan wheel 15 is to create an intake suction axially in the direction of arrow 18 and radially exhaust the air in the direction of arrow 19. A circular hole 20 is provided in the U-shaped cover 14, the air being sucked in through the hole. A suitable motor, for example, a direct current inner rotor motor 21 is mounted on the back of the plate 2, the fan wheel 15 being mounted on a shaft 24 of the motor (FIG. 1), which shaft extends through the plate in a suitable opening.

The heat sink can be, for example, a cut-to-length portion of continuous extruded metal stock in which a milling tool is used to form the recess 16. Another similar recess 22 may be also milled in the cooling rib field to provide additional space for a slightly larger electronic device, as indicated by the dash-dotted line 23, which otherwise could not fit within the interspace or channel 11.

As indicated in FIG. 2, the interspaces between the ribs and the channel 11 are covered by the U-shaped cover 14 to form enclosed ducts between which must flow the air discharged from the fan in achieving the best cooling effect. The ends of the cooling ribs, which taken together form the circumference of the recesses, including a tangential point on both outer cooling ribs 3 and 10, provide desirable channel entrances for the forced air into the respective ducts and thus contribute to the release of the radial air flow on the pressure side of the fan. The air is directed outwardly in both longitudinal directions from the center of the heat sink to the open ends of the respective ducts.

Figure 3:
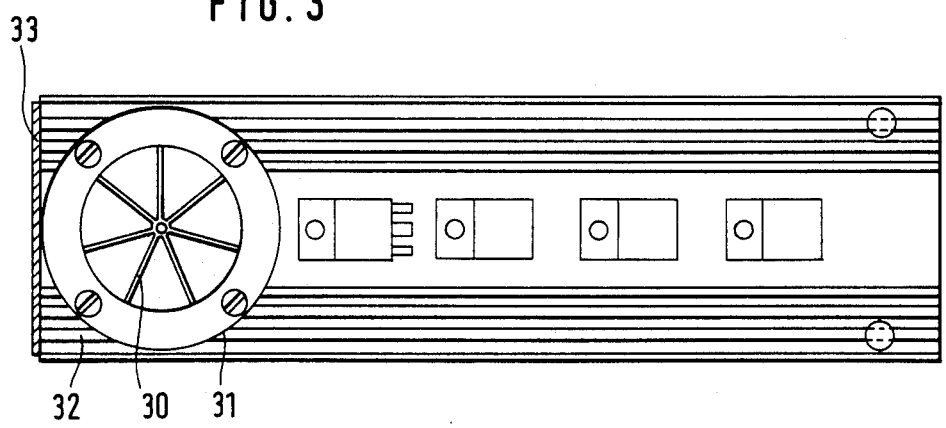
FIG. 3 is a plan view of another embodiment of the invention shown in FIG. 1.

The embodiment of FIG. 3 differs from the embodiment of FIGS. 1 and 2 primarily in that the fan wheel and its corresponding power motor (not shown) and a corresponding mounting recess 31 are disposed near one end of the heat sink instead of in the longitudinal center as in the embodiment of FIGS. 1 and 2. The ends of the ducts between the cooling ribs (all represented by a single reference no. 32) at the fan mounting end are closed by a strip 33. Thus, all of the exhaust air from the fan wheel 30 must pass through the ducts toward discharge at the open ends of the ducts at the opposite end of the heat sink.

According to the embodiment shown in FIGS. 4 and 5, cooling ribs 40, 41 and 42 are provided on one side and 46, 47 and 48 are provided on the opposite side of a plate 45 (which otherwise corresponds to plate 2 in FIG. 1); i.e., on the first mounting side facing the observer in FIG. 4 and on the second mounted side turned away from the observer (the upper side in FIG. 5). These views represent only one-half of the heat sink as shown on one side of a line of symmetry 50. It is understood that the other half is a mirror image of that shown. A drive motor 51, which in the example may be an outer rotor motor, is supported within a circular recess 43, which recess is coaxial with a lower recess, the two of which extend through both cooling rib fields. An opening in the plate 45 provides communication between the back-to-back recesses. The motor 51 carries two radial fan wheels 52 and 53 on the circumference of its outer rotor. The radial fan wheel 53 blows air into the ducts between the cooling ribs 46, 47 and 48 on one device mounting side of the heat sink, and the other fan wheel 52 blows air into the ducts between the cooling ribs 40, 41, 42 on the other device mounting side. On both sides the cooling ribs are arranged in groups. Cooling ribs 40, 41, 42 form one group on one side. The distances between the cooling ribs in a group are substantially equal to each other, but a channel 55 is provided between the groups on each side. The electronic devices to be cooled are illustrated dash on both sides of the plate 45 and are secured or arranged in this channel 55 as described earlier in relation to the embodiment shown in FIGS. 1 and 2.

The free side edges of the cooling ribs are covered on one side by a plate 57 of electrically insulating material and on the other side by a formed pan-like metal cover 58. A suction opening 59 is provided in the plate 57 for the intake of the fan wheel 52, and a ring of suction openings opposite the fan wheel 53 is provided in the metal cover 58.

The embodiment of FIGS. 6 and 7 differs from the embodiment of FIGS. 4 and 5 by the location of the fan wheel and its corresponding recesses 44 being at one end of the plate 62 instead of being in the longitudinal center of the plate. The plate 62 corresponds to the plate 45 in FIGS. 4 and 5. Also, there is only a single fan wheel 60 provided in the embodiment of FIG. 6 instead of the two fan wheels 52 and 53 in FIG. 4. This single fan wheel 60 extends through an opening of a corresponding size in the plate 62 so as to affect both sides of the plate 62 by blowing cool air into the ducts between the ribs on both mounting sides of the plate. The flow of air from the fan is sucked in through an opening 69 in a plate 67. This opening 69 corresponds to the suction opening 59 in the plate 57 of FIG. 5, the plate 67 corresponding to the plate 57 in that embodiment. A special suction opening in the opposing cover plate can be dispensed with if the opening through 61 is sufficiently large.

Thus, there has been provided in accordance with the invention, a forced air cooled heat sink having a structure that provides efficient cooling of electronic devices by all of the output air of the fan being directed through ducts to dissipate device heat without loss of stray air from the fan. This allows a smaller fan to be used for a given amount of heat to be dissipated, because the fan and heat sink are combined into one unit whereby the discharge air is totally controlled and directed where needed.

It is recognized that the invention may be susceptible to various other modifications and alternative constructions in view of this disclosure. Although the invention has been shown and described in detail herein by a preferred embodiment and certain alternatives, it should be understood that there is no intention of limiting the invention strictly to this disclosure, but rather it is the intention to cover all such other modifications and alternative constructions falling within the spirit and scope of the invention as defined in the appended claims.

What we claim is:

1. A heat sink for electronic devices comprising:
   an elongated, rectangular plate;
   a plurality of cooling ribs provided on one side of said plate, said ribs extending parallel to each other longitudinally of the plate and perpendicularly thereof;
   a channel extending longitudinally in the center of said plate and separating said ribs into two longitudinally extending groups, said channel providing space for receiving and mounting electronic devices therein;
   a recess formed in at least some of said ribs; and
   a fan having a fan wheel, said fan being mounted on said plate with its axis perpendicular thereto and with the fan wheel in said recess.

2. A heat sink according to claim 1 wherein said recess is formed to tightly radially surround the fan wheel.

3. A heat sink according to claim 1 or 2 wherein said recess is centered from side to side and extends transversely of said plate to the inside wall of both outermost ribs.

4. A heat sink according to claim 2 wherein said ribs are all of the same height and further comprising a U-shaped cover mounted to overlie their free edges creating a plurality of enclosed air ducts between adjacent ribs, said ducts having open ends.

5. A heat sink according to claim 4 wherein the recess and fan are located centrally of said plate and said fan wheel has a radial discharge of air whereby air is discharged through the air ducts outwardly in both directions from said fan to the open ends of said ducts.

6. A heat sink according to claim 4, wherein the recess and the fan are located at one end of said plate and said fan wheel has a radial discharge of air, and further comprising a closing strip mounted over the ends of the air ducts adjacent said fan and recess whereby air is discharged through the ducts along the entire length of said plate to the open opposite ends of said ducts.

7. A heat sink according to claim 4, 5 or 6, wherein the fan wheel is a mixed flow wheel of radial discharge and the motor is an inner rotor motor, the fan wheel being mounted on the shaft of the motor and the motor being mounted on the side of the heat sink opposite the side having the cooling ribs, the motor shaft extending through the plate and carrying the fan wheel in the recess on the ribbed side of said plate.

8. A heat sink according to claim 4 further comprising a plurality of cooling ribs provided also on the opposite side of the plate, said ribs extending parallel to each other longitudinally of the plate and perpendicularly thereof;
   a channel extending longitudinally in the center of said plate and separating said ribs on the opposite side into two longitudinally extending groups, said channel providing space for receiving and mounting electronic devices therein;
   a recess formed in at least some of said ribs on the opposite side of said plate and being located such that the recesses on both sides of said plate are coaxially related; and
   an opening in the plate providing communication between the opposing recesses, the fan wheel of said fan having a radial air discharge and being located within said recesses to radially discharge air for cooling on both sides of said plate.

9. A heat sink according to claim 8 wherein said motor is an outer rotor motor, the motor for the most part being located within the coaxial recesses.

10. A heat sink for electronic devices comprising:
    an elongated, rectangular plate;
    a plurality of cooling ribs provided on both sides of said plate, said ribs extending parallel to each other longitudinally of the plate and perpendicularly thereof;
    a channel extending longitudinally in the center of said plate and separating said ribs on each side into two longitudinally extending groups, said channel on each side providing space for receiving and mounting electronic devices therein;
    a recess on each side formed in at least some of said ribs and located such that both opposing recesses are coaxially related;
    an opening in the plate providing communication between the opposing recessing; and
    a fan having a fan wheel, said fan having a radial air discharge and being mounted on said plate with its axis perpendicular thereto and with the fan wheel located within said recesses to radially discharge air for cooling on both sides of said plate.

11. A heat sink according to claim 10 wherein said recesses are formed to tightly radially surround the fan wheel.

12. A heat sink according to claim 11 wherein said ribs are all of the same height and further comprising a U-shaped cover mounted to overlie their free edges creating a plurality of air ducts between adjacent ribs.

13. A heat sink according to claim 10 wherein said motor is an outer rotor motor, the motor for the most part being located within the coaxial recesses.

* * * * *

UNITED STATES PATENT AND TRADEMARK OFFICE
CERTIFICATE OF CORRECTION

PATENT NO. : 4,513,812

DATED : April 30, 1985

INVENTOR(S) : Papst et al.

It is certified that error appears in the above-identified patent and that said Letters Patent is hereby corrected as shown below:

Col. 3, Line 63, after "illustrated" delete --dash--.

Col. 4, Line 4, after "openings" insert --56--.

Signed and Sealed this

Eighth Day of April 1986

[SEAL]

Attest:

DONALD J. QUIGG

Attesting Officer

Commissioner of Patents and Trademarks